United States Patent
Peng et al.

(10) Patent No.: US 10,910,471 B2
(45) Date of Patent: Feb. 2, 2021

(54) DEVICE WITH LARGE EPI IN FINFETS AND METHOD OF MANUFACTURING

(71) Applicant: GLOBALFOUNDRIES Inc., Grand Cayman (KY)

(72) Inventors: Jianwei Peng, Latham, NY (US); Sang Woo Lim, Ballston Spa, NY (US); Matthew Wahlquist Stoker, Ballston Lake, NY (US); Huang Liu, Mechanicville, NY (US); Jinping Liu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/032,878

(22) Filed: Jul. 11, 2018

(65) Prior Publication Data
US 2020/0020769 A1  Jan. 16, 2020

(51) Int. Cl.
*H01L 29/76*     (2006.01)
*H01L 29/08*     (2006.01)
*H01L 21/8238*   (2006.01)
*H01L 27/092*    (2006.01)

(52) U.S. Cl.
CPC .. *H01L 29/0847* (2013.01); *H01L 21/823814* (2013.01); *H01L 21/823821* (2013.01); *H01L 27/0924* (2013.01)

(58) Field of Classification Search
CPC .......... H01L 29/0847; H01L 21/82314; H01L 27/0924
See application file for complete search history.

(56) References Cited

U.S. PATENT DOCUMENTS 9,666,533 B1 *  5/2017  Basker ............. H01L 21/76897
10,020,307 B1   7/2018  Holt et al.
2016/0284822 A1 * 9/2016  Cai ..................... H01L 21/0228

FOREIGN PATENT DOCUMENTS

TW    201620041 A    6/2016
TW    201639161 A    11/2016

OTHER PUBLICATIONS

Holt et al., U.S. Appl. No. 15/630,547, filed Jun 22, 2017, "Pre epi physical blocking layer to enable bigger epi and reduced N/P shorts".
Peng et al., U.S. Appl. No. 15/407,960, filed Jan. 17, 2017, "Self-Aligned Junction Patterning Process in FinFET technology".
Taiwanese Office Action for related Taiwanese Patent Application No. 108120115 dated Sep. 11, 2020, 14 Pages.

* cited by examiner

*Primary Examiner* — Samuel A Gebremariam
(74) *Attorney, Agent, or Firm* — Ditthavong & Steiner P.C.

(57) ABSTRACT

A method of forming a logic or memory cell with an epi-RSD width of larger than 1.3× fin pitch and the resulting device are provided. Embodiments include a device including a RSD region formed on each of a plurality of fins over a substrate, wherein the RSD has a width larger than 1.3× fin pitch, a TS formed on the RSD, and an ILD formed over the TS.

10 Claims, 12 Drawing Sheets

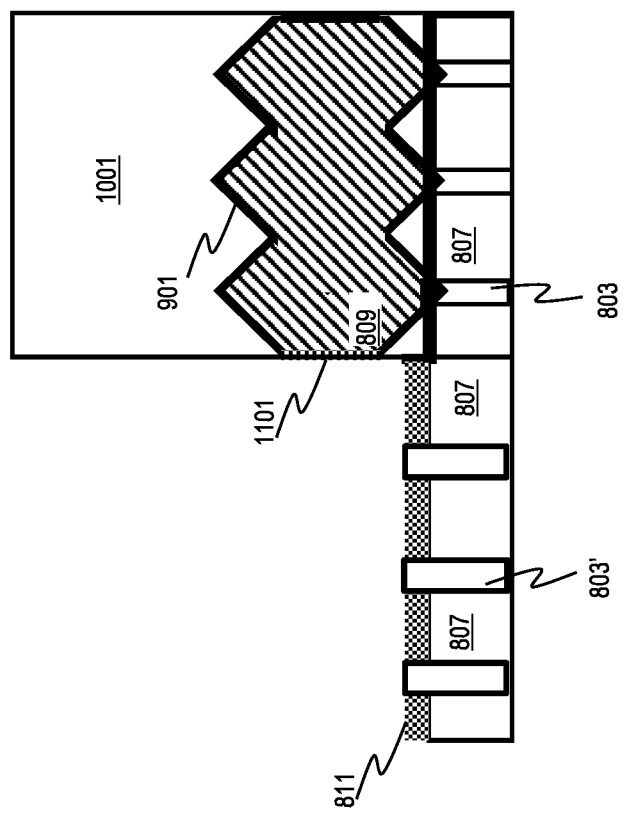

US 10,910,471 B2

DEVICE WITH LARGE EPI IN FINFETS AND METHOD OF MANUFACTURING

TECHNICAL FIELD

The present disclosure relates to devices with large raised source/drain (RSD) regions for fin-type field-effect transistor (FinFET) devices, and methods of manufacturing thereof. The present disclosure is particularly applicable to the 7 nanometer (nm) technology nodes and beyond.

BACKGROUND

Larger epitaxial (EPI) width increases the performance of advanced semiconductor devices of the 7 nm technology node or beyond, e.g., at the 5 nm technology node. In FinFET technology, epi-RSD width is limited to 0.7× to 1.3× fin pitch by the tight layout and epi-RSD process variation/facet characteristics. Larger epi-RSD, e.g., silicon phosphorus (eSiP), is desirable since 1 nm eSiP correlates to 1% nFET performance increase, and similar effect for pFET. An EPI width larger than 3× fin pitch causes a yield loss penalty, as a long tail of the epi-RSD width larger than 3× fin pitch results in a smaller N-P space. A need, therefore, exists for growing epi-RSD width to be larger than 1.3× fin pitch without the yield loss penalty and the resulting device.

SUMMARY

An aspect of the present disclosure is a device including an RSD region formed on each of a plurality of fins over a substrate, wherein the RSD has a width larger than 1.3× fin pitch.

Another aspect of the present disclosure is a process for forming RSD regions by EPI growth each with a width larger than 1.3× fin pitch and with a margin between an exposed side of the epi-RSD on top of a first group of fins and a spacer of a second group of fins.

Another aspect of the present disclosure is a process for forming RSD regions by EPI growth each with a width larger than 1.3× fin pitch and with a liner on the exposed side of the epi-RSD on top of the first group of fins.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a device including: a RSD region formed on each of a plurality of fins over a substrate, wherein the RSD has a width larger than 1.3× fin pitch; a trench silicide (TS) formed on the RSD; and an interlayer dielectric (ILD) formed over the TS.

Another aspect of the present disclosure is a method including: forming a first group and a second group of fins extending above a shallow trench isolation (STI) layer; forming a RSD region by EPI growth on each fin of the first group of fins at a first junction, wherein the RSD has a width larger than 1.3× fin pitch; depositing a first patterning resist on the epi-RSD in the first junction; exposing a side of the epi-RSD closest to the second group of fins; and forming a sacrificial liner over and between the epi-RSD including the exposed side in the first junction and over a spacer covering the fins of the second group.

A further aspect of the present disclosure is a method including: forming a first group and a second group of fins extending above a STI layer; forming a RSD region by EPI growth on each fin of the first group of fins at a first junction, wherein the RSD has a width larger than 1.3× fin pitch; forming a sacrificial liner over and between the epi-RSD in the first junction and over a spacer covering the fins of the second groups; depositing a first patterning resist over the sacrificial liner in the first junction; exposing a side of the epi-RSD closest to the second group of fins; and forming a liner on the exposed side of the epi-RSD.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which:

FIGS. 8 through 12 schematically illustrate sequential steps of a method of forming a large RSD region by EPI growth in the logic or memory cell of FIG. 1, in accordance with another exemplary embodiment.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of existing epi-RSD width of 0.7× to 1.3× fin pitch, and a yield loss penalty of an epi-RSD width smaller than 3× fin pitch attendant upon forming logic and memory cell devices of and beyond the 7 nm technology node. The problems are solved, inter alia, by forming a RSD region by EPI growth with a width larger than 1.3× fin pitch.

Methodology in accordance with embodiments of the present disclosure includes forming a device including a RSD region formed on each of a plurality of fins over a substrate, wherein the RSD has a width larger than 1.3× fin pitch. A TS is formed on the RSD, and an ILD is formed over the TS.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
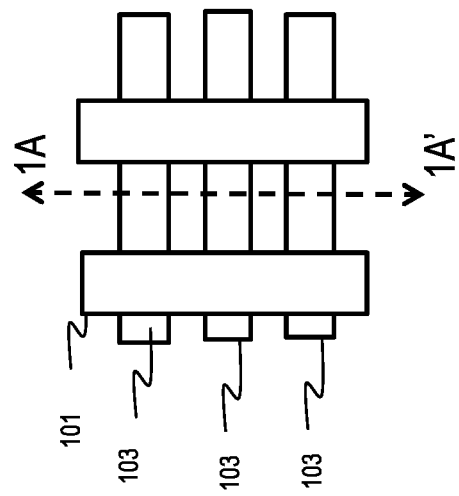
FIG. 1 schematically illustrates a top view of a logic or a memory cell, in accordance with an exemplary embodiment.
Figure 2:
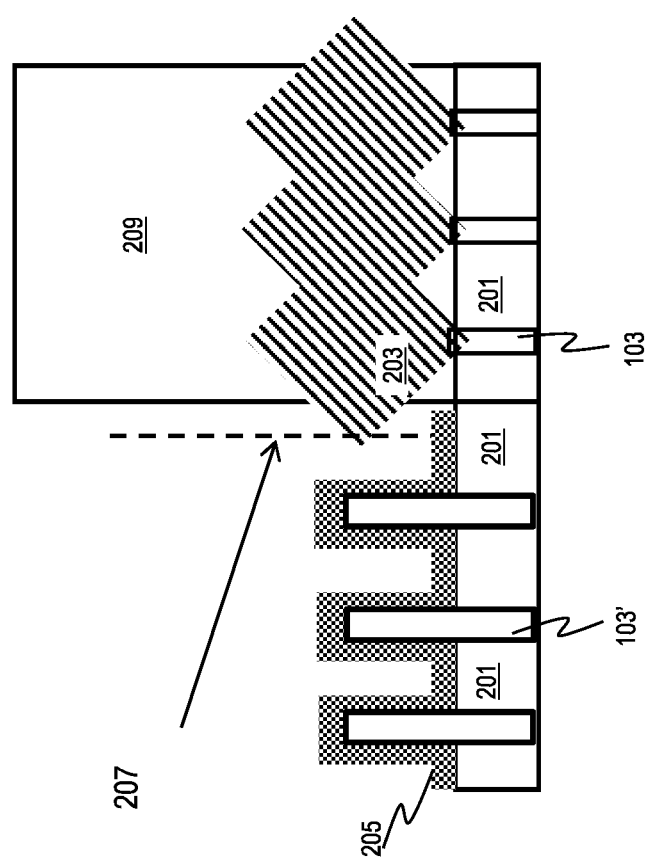
FIGS. 2 through 7 schematically illustrate sequential steps of a method of forming a large RSD region by EPI growth in the logic or memory cell at a cut line 1A-1A' of FIG. 1, in accordance with an exemplary embodiment.

FIG. 1 is a top view of a FinFET device with EPIs. The device includes gates 101 across and perpendicular to fins 103. FIGS. 2 through 7 schematically illustrate sequential steps of a method of forming a large RSD region by EPI in the logic or memory cell at a cut line 1A-1A' of FIG. 1, in accordance with an exemplary embodiment. Referring to FIG. 1, a gate 101 is formed over the plurality of fins 103 and 103'. In FIG. 2, the group of fins 103 and 103' are formed on a substrate 105 (not shown for illustrative convenience) with a first group of fins 103 in a first/right junction and a second group of fins 103' in a second/left junction. Fins 103 and 103' extending above a STI layer 201. RSD regions 203 are diamond-shaped and are formed, e.g., by EPI growth, on each of the first group of fins 103 in the first/right junction.

In one instance, one important difference between FIG. 2 and a FinFET device is that the RSD regions 203 are bigger. By way of example, in the FinFET device, the RSD regions are formed to a width, e.g., of a range of about 0.7× to about 1.3× fin pitch, thus the diamond-shaped cross-sections only contacting each other, while in FIG. 2, the RSD regions 203 are formed on each of the fins 103, e.g., by EPI growth, having a width, e.g., larger than about 1.3× fin pitch, hence the diamond-shaped cross-sections overlapping with each other. The larger epi-RSD 203 increases device performance, especially when the epi-RSD has a large variation, such as eSiP in a 7 nm technology node. The RSD regions 203 may be formed, e.g., of silicon germanium (SiGe), silicon phosphorous (SiP), silicon carbon phosphorous (SiCP), silicon carbon boron (SiCB) or any other materials with similar functional properties. In one instance, the EPI growth may be performed at a temperature, e.g., of 500° C. to 800° C., for a time period, e.g., of 0.5 minutes to 60 minutes, and at a pressure, e.g., of 1 Torr to 500 Torr.

Referring back to FIG. 2, spacers 205 are respectively formed over the tops and sides of the second groups of fins 103' in the second/left junction, such that the second groups of fins 103' can be shielded from a spin-on hardmask (SOH) patterning performed later for the first/right junction. FIG. 2 introduces a reference SOH patterning line 207, and a SOH material 209 for removing portions in the first/right junction in FIG. 2. Unlike the SOH patterning line in making the FinFET device, the reference SOH patterning line 207 is shifted towards the epi-RSD regions 203 to reserve a margin, e.g., of about 3 nm, of the related inserted pattern for lithography alignment and overlay (OVL)-control, e.g., development critical dimension (CD) control 10 nm.

Figure 3:
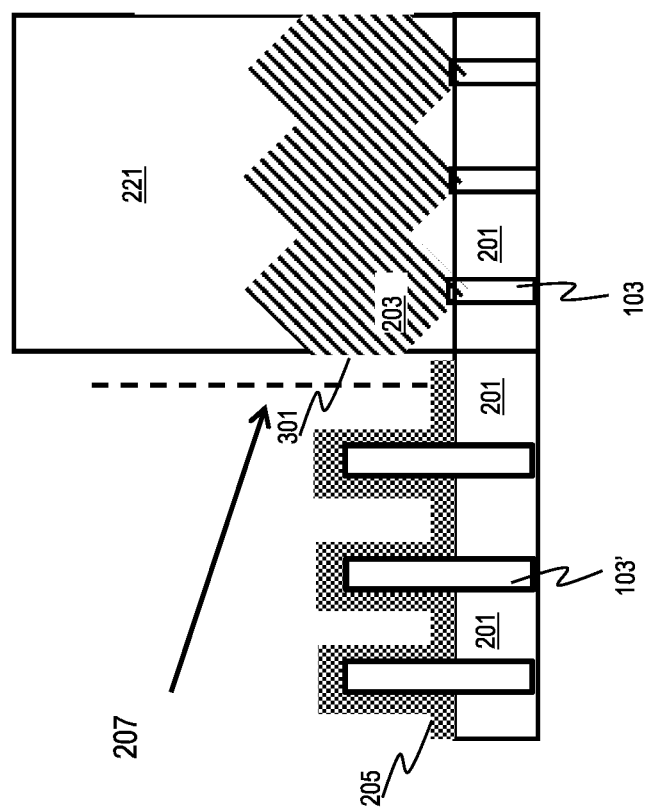

Referring to FIG. 3, an SOH material 209 is deposited over each epi-RSD 203 in the first/right junction, and portions of epi-RSD 203 not covered by the SOH material 209 are removed, e.g., by selective anisotropic etching, in the first/right junction. In one instance, the etchants, e.g., $CF_3$, Cl, or hydrogen bromide (HBr), may be used for selective anisotropic etching. The removed portions include an exposed side 301 of the epi-RSD 203 closest to the second group of fins 103'. By way of example, a width of the exposed side 301 of the epi-RSD 203 is about 0.1× fin pitch.

Figure 4:
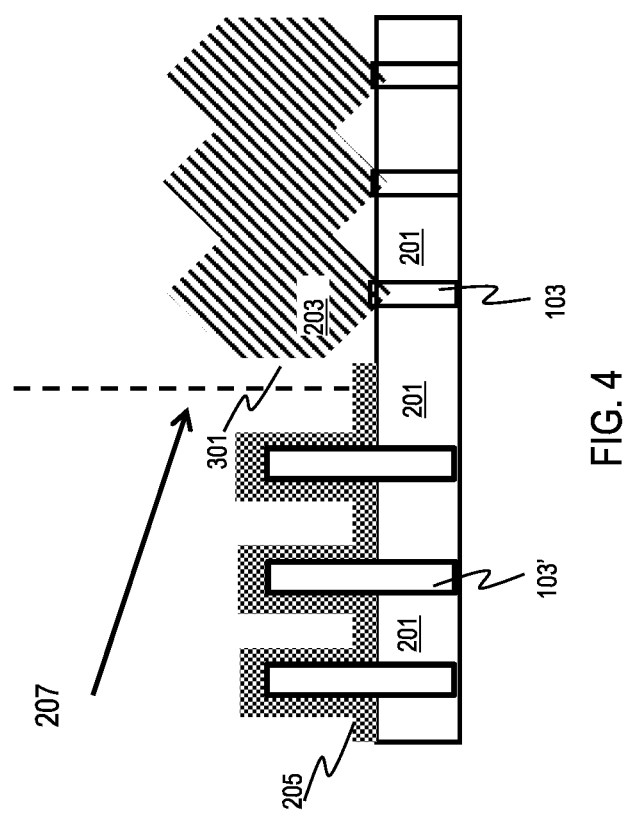

As illustrated in FIG. 4, the SOH material 209 is removed, e.g., by ashing followed by cleaning, in the first/right junction. The cleaning may be performed, e.g., by wet etching using SC1, DHF, and SPM chemistries. These steps for forming the exposed side 301 of the epi-RSD 203 are omitted from the conventional processing. The known epi-RSD does not have the dry-etched portions of the epi-RSD 203 (including the exposed side 301 of the epi-RSD 203 closest to the second group of fins 103').

Figure 5:
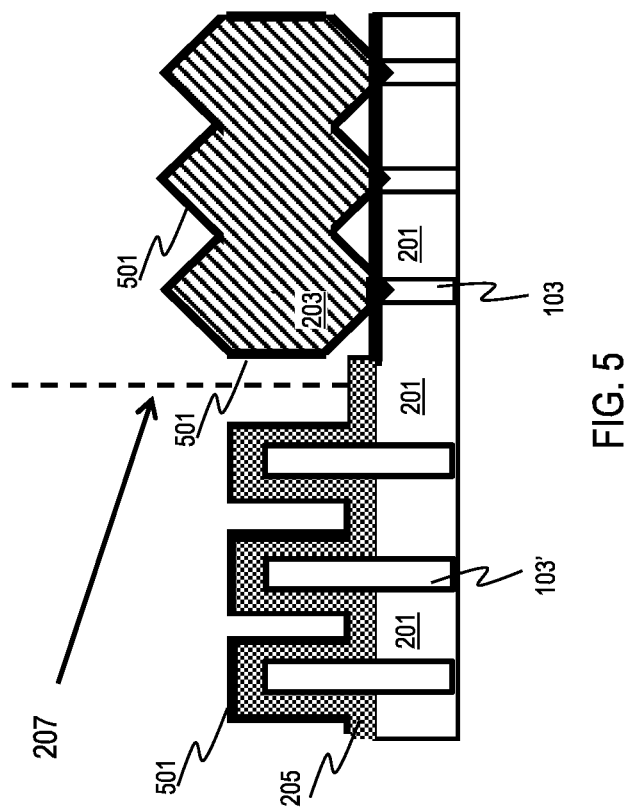

As depicted in FIG. 5, liner 501 is formed, e.g., of silicon dioxide ($SiO_2$), aluminum oxide ($Al_2O_3$), hafnium oxide ($HfO_2$), silicon oxynitride (SiON), silicon-carbon-boron-nitrogen (SiCBN), silicon-carbon-oxynitride (SiCON), silicon carbon nitride (SiCN) or silicon boron nitride (SiBN), over the tops and sides of the fins 103 and 103', and over exposed surfaces of the STI layers 201, respectively. In this instance, the liner 501 may be formed, e.g., to a thickness of 25 Å to 150 Å.

Figure 6:
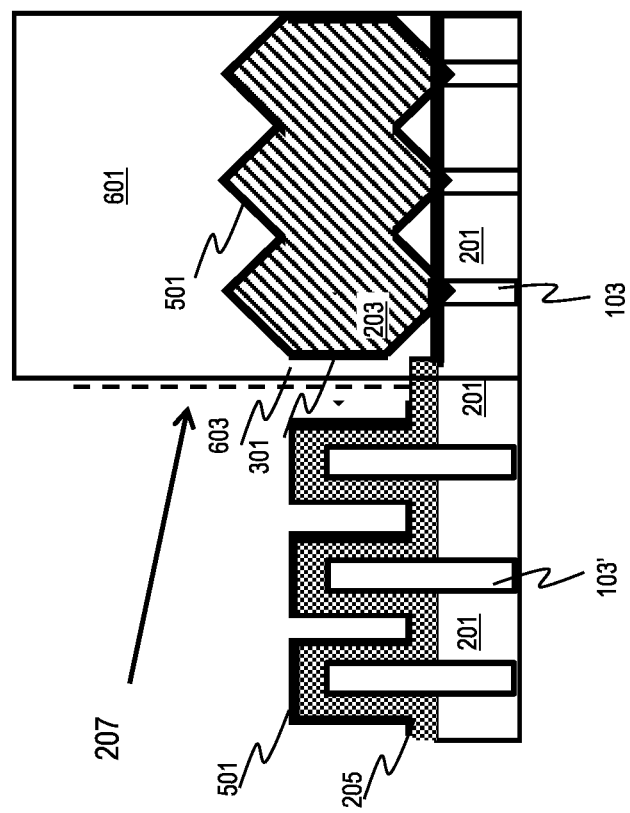

Referring to FIG. 6, a second patterning resist 601 is deposited over the liner 501 on each epi-RSD 203 using the same reference SOH patterning line 207. In this instance, the known epi-RSD does not have any exposed side like the one of the epi-RSD 203 closest to the second group of fins 103'. In addition, a margin 603, e.g., 3 nm thick, is reserved between the exposed side 301 of the epi-RSD 203 and the reference SOH patterning line 207, to keep the exposed side 301 away from the spacer of the second group of fins 103' in the second/left junction.

Figure 7:
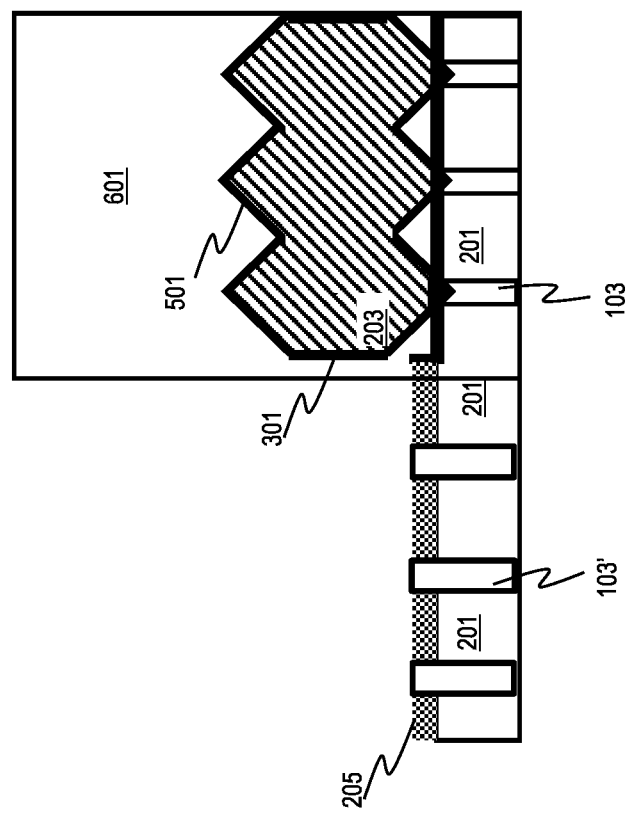

As illustrated in FIG. 7, while the second patterning resist 601 remain in the first/right junction, a cavity of the second/left junction is formed using a third patterning resist (not shown for illustrative convenience) over the second/left junction to dry-etch away portions of the second group of fins 103' that is above the STI layer 201 in the second/left junction. In one instance, the dry etchant for the second/left junction cavity may include Cl, HBr, Ar, He, $CF_4$, or $O_2$. The third patterning resist is then removed, e.g., by ashing followed by cleaning, from the second/left junction. Subsequently, trench silicide (TS) is formed on RSD 203 and extends past the outside edges of the fins 103, and an ILD is formed between and adjacent to the TS (not shown for illustrative convenience).

In one instance, a RSD region in a diamond shape can then be formed, e.g., by EPI growth, on each fin of the second group of fins 103' in the second/left junction. In another instance, the RSD regions in the first/right junction and the RSD regions in the second/left junctions are the same N-type or P-type. In a further instance, the RSD regions in the first/right junction and the RSD regions in the second/left junctions are different types, such as one is N-type and the other is P-type.

Figure 8:
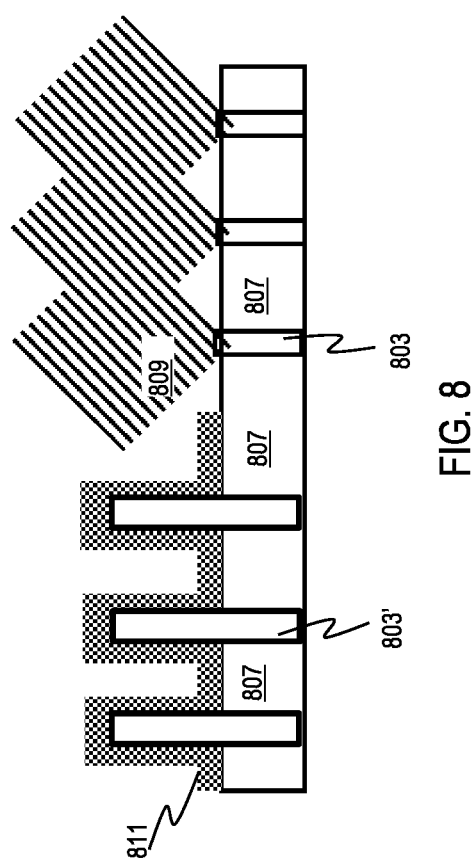

FIGS. 8 through 12 schematically illustrate sequential steps of a method of forming a large RSD region by EPI growth in the logic or memory cell of FIG. 1, in accordance with another exemplary embodiment. As depicted in FIG. 8 of the second exemplary embodiment, similar to the gate 101 formed over the plurality of fins 103 and 103', a gate 801 (not shown for illustrative convenience) is formed over a plurality of fins 803 and 803'. Similar, to the group of fins 103 and 103' are formed on the substrate 105 with a first group of fins 103 in a first/right junction and a second group of fins 103' in a second/left junction, the group of fins 803 and 803' are formed on a substrate 805 (not shown for illustrative convenience) with a first group of fins 803 in a first/right junction and a second group of fins 803' in a second/left junction. Like the fins 103 and 103' extending above the STI layer 201, the fins 803 and 803' extend above an STI layer 807. Both RSD regions 203 and 809 each in a diamond shape are formed, e.g., by EPI growth, on each fin of the first group of fins 103 and 803 in the first/right junction. Spacers 201 and 811 are formed over the tops and sides of the second groups of fins 103' and 803' in the second/left junction.

Figure 9:
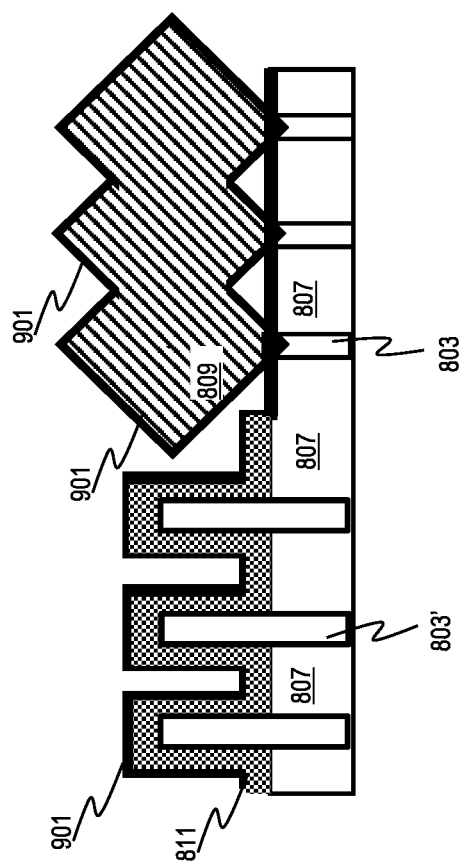
Figure 10:
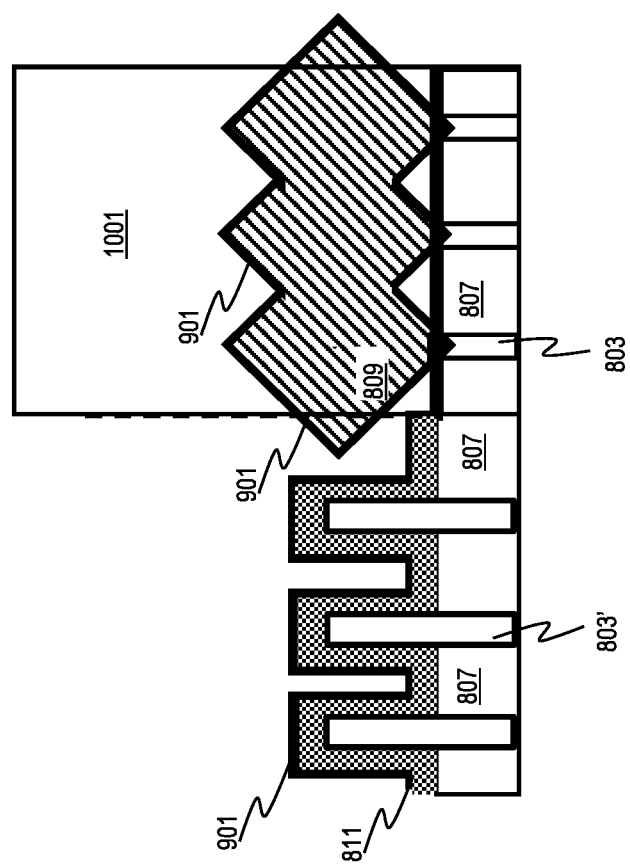

Referring to FIG. 9, sacrificial liner 901 is formed over and between each epi-RSD 809 in the first/right junction and over the spacers 811 covering the fins of the second groups 803'. As depicted in FIG. 10, first patterning resist 1001 is deposited over the sacrificial liners 903 in the first/right junction.

Figure 11:
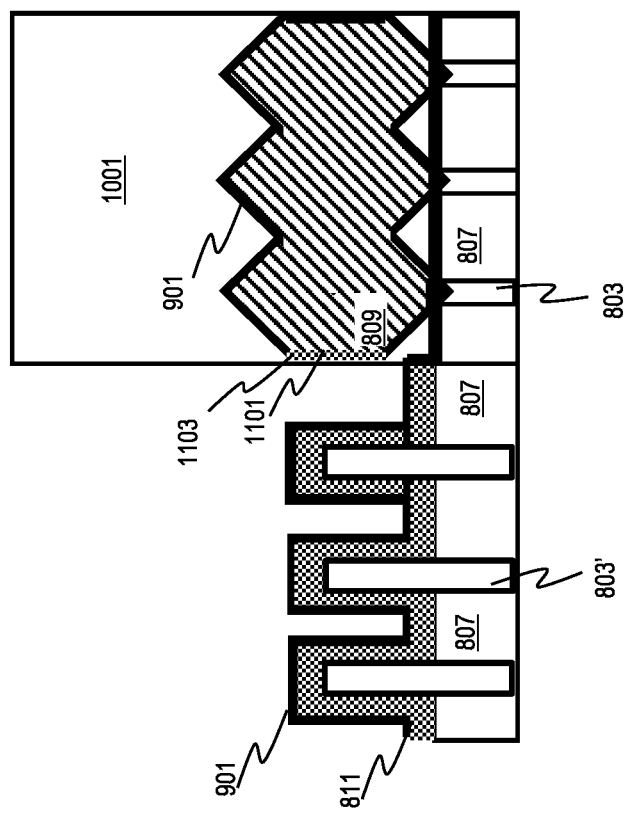

As illustrated in FIG. 11, portions of the epi-RSD 809 not covered by the first patterning resist 1001 are removed, e.g., by dry-etching, in the first/right junction to provide an exposed side 1101, while nothing is removed from the known epi-RSD. The dry-etched portions include the exposed side 1101 of the epi-RSD 809 closest to the second group of fins 803'. A liner 1103 is formed to a thickness, e.g., of 1 nm to 4 nm, on the exposed side 1101 of the epi-RSD 809 using a heavy nitride plasma process. In this instance, the nitrogen to oxide ratio in connection with the heavy nitrogen plasma is greater than one.

FIG. 11 is similar to FIG. 6, except the liner 1103 and the margin 603. In FIG. 6, the exposed side 301 of the epi-RSD 203 is covered by the liner 501 which also covers the rest of the epi-RSD 203. In FIG. 11, the liner 1103 covers only the exposed side 1101 of the epi-RSD closest to the second group of fins 803' but not covering the rest of the epi-RSD 809. In addition, the margin 603 reserved between the exposed side 301 of the epi-RSD 203 and the reference SOH patterning line 207 only shown in FIG. 6 but not in FIG. 11.

As depicted in FIG. 12, while the patterning resist 1001 remain in the first/right junction, a cavity of the second/left junction is formed using a second patterning resist over the second/left junction to dry-etch away portions of the second group of fins 803' that are above the STI layer 807 in the second/left junction. The second patterning resist over the second/left junction is then removed (e.g., via ashing and cleaning) from the second/left junction. FIG. 12 is similar to FIG. 7, except the liner 1103 and the margin 603 as discussed above.

The embodiments of the present disclosure can achieve several technical effects increasing fin-EFT performance without a yield loss penalty, for example, 1 nm eSiP correlates to 1% nFET performance increase. In addition, the overlapping-diamond cross-sectional shape of the RSD regions 203 and 809 eliminates shorts between the touching-diamond cross-sectional shape of known RSD and trench silicide (TS) on top of the known RSD, thereby increasing the yield. Embodiments of the present disclosure enjoy utility in various industrial applications as, for example, microprocessors, smartphones, mobile phones, cellular handsets, set-top boxes, DVD recorders and players, automotive navigation, printers and peripherals, networking and telecom equipment, gaming systems, and digital cameras. The present disclosure is particularly applicable to 7 nm technology nodes and beyond.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A device comprising:
    a raised source/drain region (RSD) formed on each of a plurality of fins over a substrate, wherein the RSD has a width larger than 1.3× fin pitch;
    a trench silicide (TS) formed on the RSD; and
    an interlayer dielectric (ILD) formed over the TS,
    wherein the RSD comprises an upper surface, a lower surface and an exposed side surface disposed between the upper surface and lower surface, wherein the exposed side surface is disposed over a shallow trench isolation (STI) region in the substrate, and
    wherein a liner is formed on the exposed side surface, over the STI region and the liner is separated from the STI region and substrate.

2. The device according to claim 1, wherein the RSD is formed by epitaxial (EPI) growth.

3. The device according to claim 2, wherein the width of the RSD is smaller than 3× fin pitch.

4. The device according to claim 3, wherein the plurality of fins include a first group of fins of the first type in a first junction and a second group of fins of the second type in a second junction.

5. The device according to claim 4, wherein a margin is formed between the exposed side surface and a spacer of the second group of fins.

6. The device according to claim 5, wherein the margin is 3 nm thick.

7. The device according to claim 1, wherein a width of the exposed side surface is larger than 0.1× fin pitch.

8. The device according to claim 1, wherein the liner is 1 nm to 4 nm thick.

9. The device according to claim 1, wherein the RSD is formed of silicon germanium (SiGe), silicon phosphorous (SiP), silicon carbon phosphorous (SiCP), or silicon carbon boron (SiCB).

10. The device according to claim 1, wherein the liner is formed of silicon nitride (SiN), silicon dioxide (SiO$_2$), aluminum oxide (Al$_2$O$_3$), hafnium oxide (HfO$_2$), silicon oxynitride (SiON), silicon-carbon-boron-nitrogen (SiCBN), silicon-carbon-oxynitride (SiCON), silicon carbon nitride (SiCN), or silicon boron nitride (SiBN).

\* \* \* \* \*